(12) United States Patent
Tanzawa

(10) Patent No.: US 8,796,778 B2
(45) Date of Patent: Aug. 5, 2014

(54) APPARATUSES AND METHODS FOR TRANSPOSING SELECT GATES

(75) Inventor: Toru Tanzawa, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 118 days.

(21) Appl. No.: 13/316,026

(22) Filed: Dec. 9, 2011

(65) Prior Publication Data

US 2013/0146980 A1     Jun. 13, 2013

(51) Int. Cl.
*H01L 21/70* (2006.01)

(52) U.S. Cl.
USPC .............. 257/368; 257/E27.081; 257/E21.19; 438/592

(58) Field of Classification Search
USPC .............. 257/368, E27.081, E21.19; 437/592
See application file for complete search history.

(56) References Cited

U.S. PATENT DOCUMENTS

| | | | |
|---|---|---|---|
| 7,158,409 B2 | 1/2007 | Cernea | |
| 7,177,169 B2 | 2/2007 | Scheuerlein | |
| 7,339,227 B2 * | 3/2008 | Kajimoto et al. | 257/314 |
| 7,425,739 B2 * | 9/2008 | Watanabe et al. | 257/296 |
| 7,486,554 B2 | 2/2009 | Park et al. | |
| 7,554,832 B2 | 6/2009 | Fasoli et al. | |
| 8,008,722 B2 | 8/2011 | Kim et al. | |
| 2006/0077702 A1 | 4/2006 | Sugimae et al. | |
| 2008/0130367 A1 * | 6/2008 | Kang et al. | 365/185.13 |
| 2010/0157684 A1 | 6/2010 | Kim | |
| 2010/0202206 A1 | 8/2010 | Seol et al. | |
| 2011/0058418 A1 | 3/2011 | Choi et al. | |
| 2011/0175159 A1 | 7/2011 | Itagaki et al. | |
| 2011/0233644 A1 | 9/2011 | Fukuzumi et al. | |
| 2011/0309431 A1 * | 12/2011 | Kidoh et al. | 257/324 |

FOREIGN PATENT DOCUMENTS

KR     10-2010-0075098 A     7/2010

OTHER PUBLICATIONS

International Search Report and Written Opinion for related PCT Application No. PCT/US2010/001520 dated Mar. 28, 2013 (8 pages).
Chiang, Meng-Hsueh et al. "Novel High-Density Low-Power Logic Circuit Techniques Using DG Devices", IEEE Transactions on Electron Devices, vol. 52, No. 10, Oct. 2005, pp. 2339-2342.
Jang, Jaehoon et al. "Vertical Cell Array using TCAT (Terabit Cell Array Transistor) Technology for Ultra High Density NAND Flash Memory", 2009 Symposium on VLSI Technology Digest of Technical Papers, Jun. 2009, pp. 192-193.
Katsumata, Ryota et al. "Pipe-shaped BiCS Flash Memory with 16 Stacked Layers and Multi-Level-Cell Operation for Ultra High Density Storage Devices", 2009 Symposium on VLSI Technology Digest of Technical Papers, Jun. 2009, pp. 136-137.

(Continued)

Primary Examiner — Trung Q Dang
(74) Attorney, Agent, or Firm — Brooks, Cameron & Heubsch, PLLC

(57) ABSTRACT

Apparatuses and methods for transposing select gates, such as in a computing system and/or memory device, are provided. One example apparatus can include a group of memory cells and select gates electrically coupled to the group of memory cells. The select gates are arranged such that a pair of select gates are adjacent to each other along a first portion of each of the pair of select gates and are non-adjacent along a second portion of each of the pair of select gates.

39 Claims, 12 Drawing Sheets

(56) References Cited

OTHER PUBLICATIONS

Kim, Jiyoung et al. "Novel Vertical-Stacked-Array Transistor (VSAT) for ultra-high-density and cost-effective NAND Flash memory devices and SSD (Solid State Drive)", 2009 Symposium on VLSI Technology Digest of Technical Papers, Jun. 2009, pp. 186-187.

Kim, Wonjoo et al. "Multi-Layered Vertical Gate NAND Flash Overcoming Stacking Limit for Terabit Density Storage", 2009 Symposium on VLSI Technology Digest of Technical Papers, Jun. 2009, pp. 188-189.

Tanaka, H. et al. "Bit Cost Scalable Technology with Punch and Plug Process for Ultra High Density Flash Memory", 2007 Symposium on VLSI Technology Digest of Technical Papers, Jun. 2007, pp. 14-15.

* cited by examiner

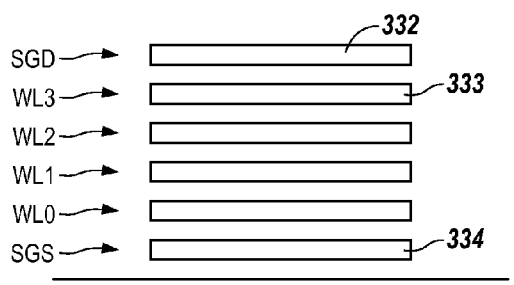
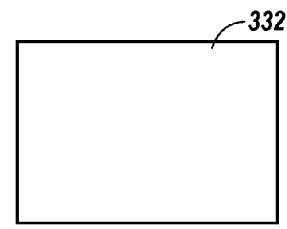
*Fig. 3A*  *Fig. 3B*
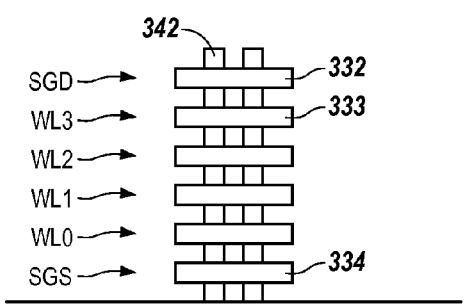
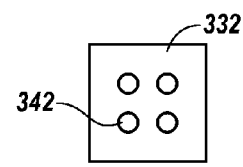
*Fig. 3C*  *Fig. 3D*

APPARATUSES AND METHODS FOR TRANSPOSING SELECT GATES

TECHNICAL FIELD

The present disclosure relates generally to semiconductor memory apparatuses and methods, and more particularly, to apparatuses and methods for transposing select gates.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), synchronous dynamic random access memory (SDRAM), resistive memory (e.g., RRAM), and Flash memory, among others.

Memory devices are utilized as volatile and non-volatile data storage for a wide range of electronic applications. Flash memory, which is just one type of memory, typically uses a one-transistor memory cell that allows for high memory densities, high reliability, and low power consumption. Non-volatile memory may be used in, for example, personal computers, portable memory sticks, solid state drives (SSDs), digital cameras, cellular telephones, portable music players such as MP3 players, movie players, and other electronic devices. Memory cells can be arranged into arrays, with the arrays being used in memory devices.

Memory devices comprise a plurality of memory cells. The memory cells can be arranged into various groups such as a block, sub-block, etc. The memory device can include select gates that enable selection of an individual memory cell and/or a particular group of memory cells to be operated upon. For example, select gates may be used to select a group of memory cells by connecting the group of memory cells to other parts of the memory device. Adjacent select gates can be capacitively coupled thereby permitting noise signals to leak from one select gate to another. Apparatuses and methods for transposing select gates can reduce capacitive coupling, and thereby reduce noise and improve memory device operation.

BRIEF DESCRIPTION OF THE DRAWINGS

FIGS. 3A-3I illustrate a process flow for reducing coupling capacitance in accordance with one or more embodiments of the present disclosure.

DETAILED DESCRIPTION

Figure 1A:
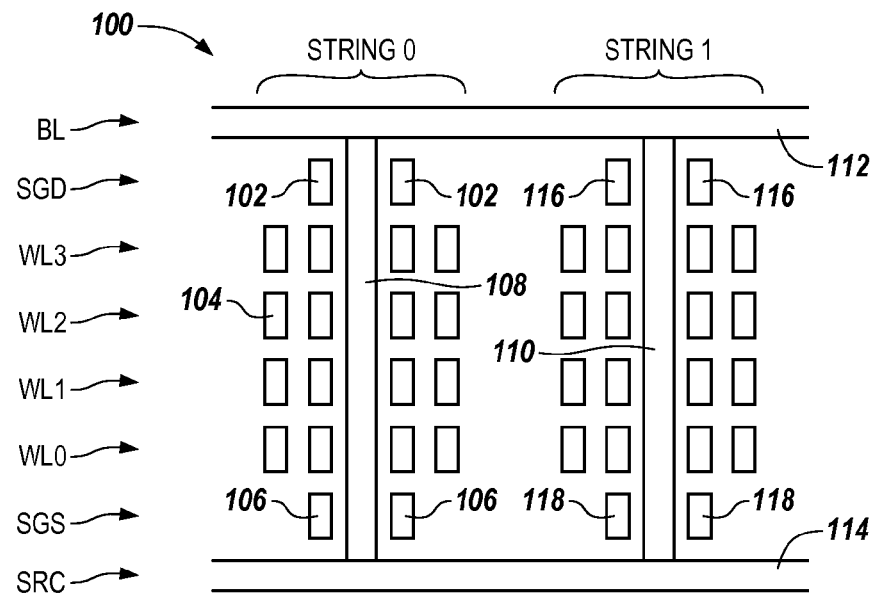
FIG. 1A is a functional block diagram of a cross-sectional view of a prior art three dimensional (3D) Not AND (NAND) memory device.

Apparatuses and methods for transposing select gates, such as in a memory device, are provided. One example apparatus can include a group of memory cells and select gates electrically coupled to the group of memory cells. The select gates are arranged such that a pair of select gates are adjacent to each other along a first portion of each of the pair of select gates and are non-adjacent along a second portion of each of the pair of select gates.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designator "N" indicates that one or more of the particular feature so designated can be included with one or more embodiments of the present disclosure.

The figures herein follow a numbering convention in which the first digit or digits correspond to the drawing figure number and the remaining digits identify an element or component in the drawing. Similar elements or components between different figures may be identified by the use of similar digits. As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present disclosure and are not to be used in a limiting sense.

The terms "first," "second," "third," and "fourth" are used herein, and in the claims, merely for convenience in differentiating the nomenclature of various features from one another. The use of such terms does not necessarily imply that the materials are of different composition, but sometimes are used to distinguish between materials formed at different elevations, at different times, or in different manners, even if of the same composition. The use of such terms does not intend to convey a particular ordering of the features, including, but not limited to, an order of forming. Furthermore, strict correspondence between terms "first," "second," "third," and "fourth" used herein is not intended with terms "first," "second," "third," and "fourth" used in the claims. That is, "second conductive material" as used in the claims may or may not correspond to the "second conductive material" described herein. For example, "second conductive material" as used in the claims may correspond to the "third conductive material" described herein.

A memory device architecture according to the present disclosure can provide a reduced capacitive coupling between adjacent select gates of a same block of memory cells compared to pairs of select gates that are everywhere adjacent. According to various embodiments, a memory device architecture, such as a three dimensional (3D) Not AND (NAND) memory device memory device architecture, can be configured to reduce capacitive coupling between adjacent select gates of a block of memory cells. As used herein, a block of memory cells can be a group of memory cells that are erased together. A block of memory cells can have a plurality of sub-blocks. That is, a sub-block of memory cells can be a portion of a block of memory cells, and each sub-block can have its own select gate, for example A large portion of power consumed by a memory device can be to charge and discharge signal lines such as select gates, data lines (e.g., bit lines), access lines (e.g., word lines), etc. As the density of memory cells in a memory device increases, such as by reducing distances between memory cells and signal lines, capacitance (e.g., parasitic capacitance) between memory cells and the signal lines can increase. Therefore, increasing parasitic capacitance can increase power consumption and heating.

Figure 1B:
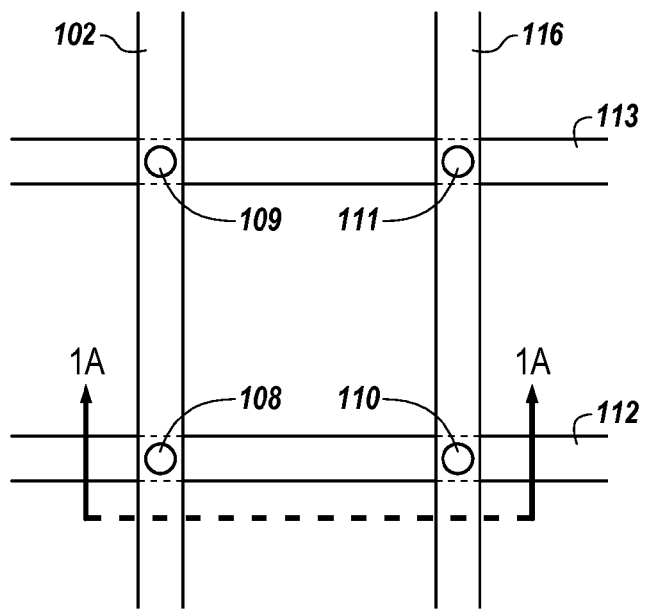
FIG. 1B is a functional block diagram of a top view of the prior art 3D NAND shown in FIG. 1A.

FIG. 1A is a functional block diagram of a cross-sectional view of a prior art three dimensional (3D) NAND memory device taken along cut line 1A-1A, as shown in FIG. 1B. Two dimensional (or planar) NAND strings can be arranged such that select gate transistors are connected at each side (e.g., source, drain) of a number of memory devices connected in series drain-to-source in a plane. Multi-dimension NAND memory devices (e.g., 3D NAND) can be formed by arranging the NAND strings in non-linear configurations, such as in a "U" shape for example. The 3D NAND can be configured such that data lines and source lines can be shared between various groups of memory cells (e.g., sub-blocks, etc). Multi-dimension NAND memory devices can be arranged vertically (e.g., vertical NAND), such as the 3D NAND memory device shown in FIG. 1A.

FIG. 1A shows a memory device 100 having a number of strings (e.g., string 0, string 1). For each string shown in FIG. 1A, a communication path 108, 110 extends from a bit line (BL) 112 to a source line (SRC) 114. The communication path 108, 110 can comprise a pillar of semiconductor material for a string of memory cells, for example. The bit line 112 and source line 114 can be shared by various strings. While FIG. 1A shows a communication path 108, 110 that can be linear and in a vertical orientation, multi-dimension NAND can have other communication path configurations and orientations between the bit line 112 and source line 114, such as a U-shaped communication path between a bit line 112 and source line 114 that can be in close proximity to one another. As such, memory cells can be arranged in a 3D memory cell string (e.g., non-linear arrangement).

The communication path 108, 110 between the bit line 112 and source line 114 associated with a particular string can have two or more select gates per string, including a drain select gate 102, 116 and a source select gate 106, 118. The two select or more gates per string operate to select the communication path 108, 110 between the bit line 112 and source line 114 of a particular string. In this manner, a particular selected memory cell can be electrically coupled to a bit line via the drain 102, 116 and source 106, 118 select gates.

As shown in FIG. 1A, the two or more select gates per string can be located at different ends of the communication path 108, 110 between the bit line 112 and source line 114. For example, one select gate can be located adjacent the bit line 112 and the other select gate can be located adjacent the source line 114. A select gate located adjacent the bit line 112 can be a drain select gate (SGD) 102, 116, which is shown as the upper select gate in FIG. 1A. The select gate located adjacent the source line 114 can be a source select gate (SGS) 106, 118, shown as the lower select gate in FIG. 1A.

A number of control gates can be arranged between the two select gates along the communication path 108, 110 between the bit line 112 and source line 114. The control gates can be arranged to select a particular memory cell on the corresponding string. The control gates can be implemented as word lines 104, as shown in FIG. 1A (e.g., WL0, WL1, WL2, and WL3).

FIG. 1B is a functional block diagram of a top view of the prior art 3D NAND memory device shown in FIG. 1A. FIG. 1B shows that a communication path 108, 109, 110, 111 can be located at the intersection between bit lines 112, 113 and select gates 102, 116.

Figure 2A:
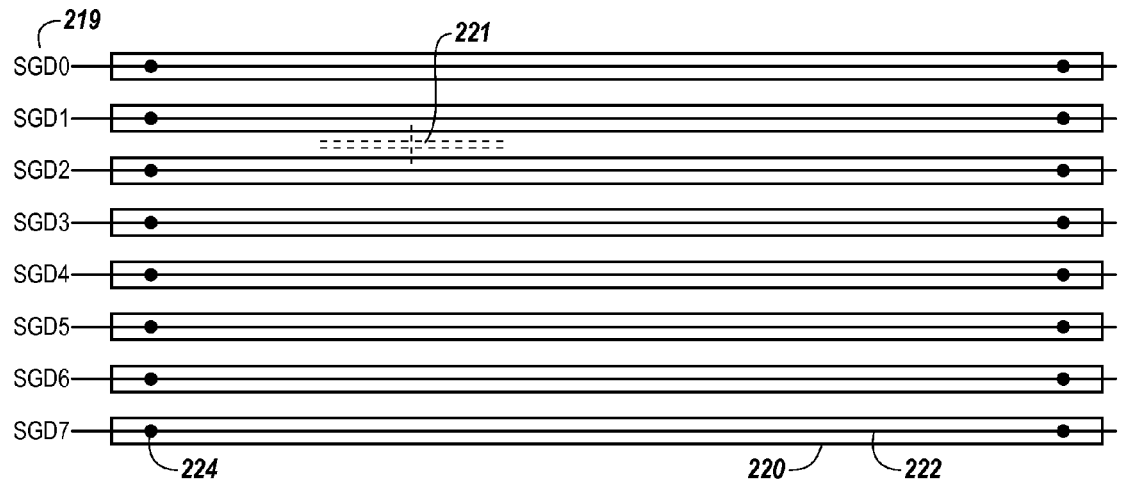
FIG. 2A is a functional block diagram of prior art non-transposed select gates.

FIG. 2A is a functional block diagram of prior art non-transposed select gates. In an effort to increase the bit density, adjacent select gates can be arranged close to each other. For example, select gates of a 3D NAND can be arranged closer to one another than select gates of some two dimensional (2D) NAND configurations. The prior art select gates 219 are routed in straight runs, as shown in FIG. 2A. The prior art select gates 219 can include a conductively-doped polysilicon portion 220, and a metal portion 222, which serves to shunt the conductively-doped polysilicon portion 220 in order to decrease resistance. A contact 224 can electrically couple the conductively-doped polysilicon portion 220 with the metal portion 222 (e.g., at each end of a select gate).

FIG. 2A shows a number (e.g., eight) of select gates 219. Each select gate 219 can extend over a relatively long distance, and can be separated from other select gates by a space (e.g., according to minimum feature size criterion). This configuration, with long runs and small spacing between select gates that are adjacent to each other everywhere can result in capacitive coupling between select gates, as indicated in FIG. 2A at 221.

Capacitive coupling can provide a pathway for noise between select gates. When one of the select gates goes high, such as for a read operation for example, an adjacent select gate(s) can receive noise via the capacitive coupling. The noise received via the capacitive coupling to the adjacent select gate(s) can increase the potential on the adjacent select gate(s), which can result in leakage current from a selected bit line to unselected sub-blocks. These transient leakage currents can increase noise and impact the accuracy of reading operations.

The capacitive coupling between adjacent select gates can be relatively large depending on dimensions by which the select gates are implemented. While capacitive coupling 221 is shown only between two of the eight select gates provided in FIG. 2A, capacitive coupling can exist between each respective pair of adjacent select gates, and such capacitive coupling is not illustrated in FIG. 2A for clarity of other aspects.

Figure 2B:
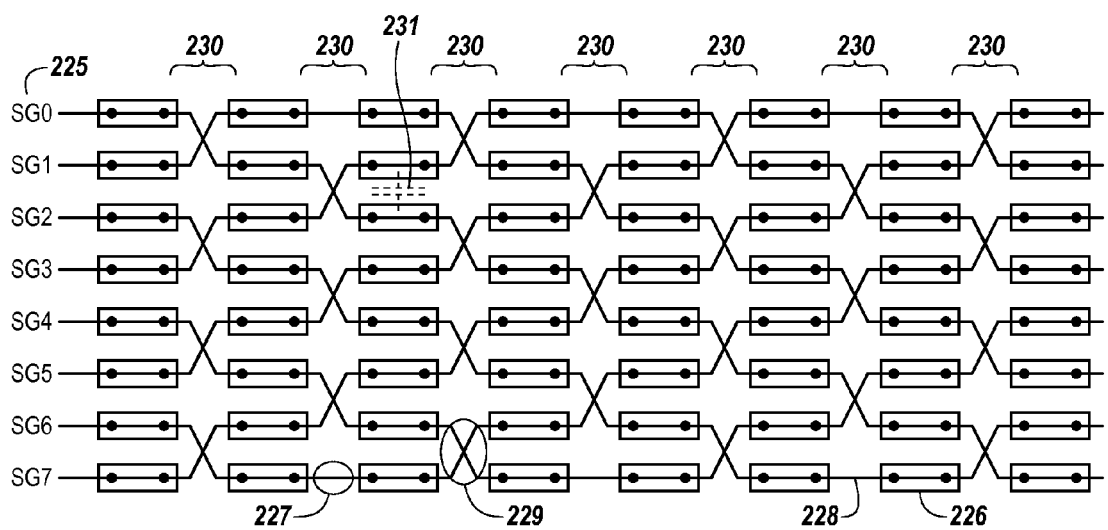
FIG. 2B is a functional block diagram of transposed select gates in accordance with one or more embodiments of the present disclosure.

FIG. 2B is a functional block diagram of transposed select gates in accordance with one or more embodiments of the present disclosure. In some embodiments, there can be 8 drain select gates in a block of memory cells. Select gates can be used to select a sub-set of the block of memory cells (e.g., a sub-block). For example, selected memory cells can be electrically coupled to a data line via a select gate for a particular sub-block. Select gates for different sub-blocks can be routed adjacent one another, such as is shown in FIG. 2B. A particular select gate 225, shown in FIG. 2B, can be separated into a number of segments, such as segment 226. That is, rather than one continuous run of a first conductive material (e.g., conductively-doped polysilicon) and a second conductive material (e.g., metal, alloy), as is shown in FIG. 2A, the particular select gate can be separated into a number of segments, such as segment 226. Each segment (e.g., segment 226) of a select gate 225 can include a first conductive material portion (sometimes referred to hereinafter as a first conductive material segment) and a second conductive material portion (sometimes referred to hereinafter as a "shunt"), with the second conductive material serving to shunt the first conductive material in order to decrease resistance along the select gate. A contact can electrically couple the first conductive material portion with the second conductive material portion (e.g., at each end of a segment).

FIG. 2B shows each select gate 225 of the number of select gates illustrated in FIG. 2B being comprised of 8 segments 226. The 8 segments (e.g., segment 226) per select gate 225, for each of 8 select gates, results in 64 total segments arranged in 8 rows and 8 columns, as shown in FIG. 2B. However, embodiments of the present disclosure are not so limited, and select gates can be separated into more or fewer segments. For example, select gates could be separated into 4 segments per select gate. According to some embodiments, N select gates can be separated into M segments each. M can be equal to N in various embodiments, and M can be a number different than N in other various embodiments (e.g., M equal to N/2, N/4, etc.). The greatest capacitive de-coupling can be achieved where M is equal to N. However, the cost for such maximum benefit is a greater number of transpositions. Some capacitive de-coupling can be achieved where M is less than N, which uses fewer transpositions. According to various embodiments, the M segments of the N select gates can be arranged such that at most 2 segments of each select gate are adjacent to segments of any other select gate. According to some embodiments, the M segments of the N select gates can be arranged such that segments of each select gate can be adjacent to segments of all of the other select gates in the block. For example, a first segment of a first select gate can be adjacent to a first segment of a second select gate, and a second segment of the first select gate can be adjacent to a second segment of a third select gate, and so on, as is illustrated in FIG. 2B.

According to various embodiments of the present disclosure, all select gates need not be separated into a same quantity of segments. That is, respective select gates may be separated into different quantities of segments. For example, some select gates may be separated into 4 segments, and other select gates can be separated into 8 segments. Some select gates may not be separated into multiple segments, while others may be separated into multiple segments. The quantity and arrangement of segments for individual select gates can be different than shown to achieve desired performance and/or other criteria.

Adjacent segments of a particular select gate can be electrically coupled via an interconnection 227 extending from one segment (e.g., segment 226) to another. The interconnection 227 between segments (e.g., segment 226) can be comprised of metal, conductively-doped polysilicon, combinations thereof, and/or involve other compositions. The interconnection 227 between segments (e.g., segment 226) can be a non-transposed interconnection 228 or transposition 229 of interconnections. For example, each of the interconnections included in the transposition 229 can comprise a respective extension of the metal portion of a segment, that can be positionally interchanged between a boundary of the conductively-doped polysilicon portion of a segment (e.g., segment 226) and a boundary of the conductively-doped polysilicon portion of a next segment having a different horizontal coordinate, as shown in FIG. 2B.

In this manner, segments of different select gates can be brought into proximity of one another so that one particular select gate is not always adjacent another particular select gate, and instead can have portions that are adjacent each of the other select gates. According to various embodiments, each select gate can have a segment adjacent a respective segment of each other select gate of a block, as shown in FIG. 2B. Where N select gates of a block are each separated into N segments, the select gates can be configured using transposed interconnections to be adjacent any other particular select gate for 2/N of the select gate run. For example, 8 select gates can be each separated into 8 segments. The select gates can be configured using transposed interconnections to be adjacent any other particular select gate for 2/8 (i.e., ¼) of the select gate run.

The segments (e.g., segment 226) of the select gates are still capacitively coupled, as indicated in FIG. 2B at 231. The capacitor depicted at 231 in FIG. 2B, representative of the capacitive coupling between transposed select gates, can be relatively smaller than the capacitor shown at 221 in FIG. 2A, representative of the capacitive coupling between non-transposed select gates, to convey that the capacitive coupling between transposed select gates can be relatively smaller than the capacitive coupling between non-transposed select gates. That is, the capacitive coupling of a particular select gate is divided up among the other select gates since only a portion of a particular select gate is adjacent to another select gate, as compared to the capacitive coupling of two select gates that are always adjacent to one another (e.g., along an entire run of the select gates).

However, the distance for which pairs of select gates are adjacent can be configured using transposed interconnections to be, for example, ¼ the entire run of the individual select gates. Therefore, the capacitive coupling between any 2 select gates can be reduced by a factor of ¾. That is, instead of leakage current generated by a particular select gate flowing to one other adjacent select gate, the leakage current can flow to several other select gates through adjacent segments. In this way, the leakage current flowing to any one other particular select gate can be reduced, thereby reducing the noise induced.

According to some embodiments, metal portions of every select gate can be routed so that the conductively-doped polysilicon portions of two segments of the select gates are routed in the minimum pitch. However, embodiments of the present disclosure are not so limited. That is, capacitive coupling can be reduced by transpositions that bring at least one segment of a select gate adjacent to a segment of a different select gate than would be adjacent if the select gates are straight runs.

According to one or more embodiments of the present disclosure, the respective select gates of each pair of select gates of a block can be transposed with one another at least once. According to various embodiments, some, but less than all, select gates of a block can be transposed with one another. According to some embodiments, each select gate of a block can be transposed at least once with each of the other select gates of the block. Select gates can be configured such that particular select gates are adjacent one another along some respective portion(s), and to be non-adjacent along another portion(s). Select gates can further be configured such that portions of a particular select gate can be adjacent portions of all of the other select gates of a block. For example, a select gate can be transposed at least once with an adjacent select gate. According to another example, select gates can be transposed more than once with one, or several different, other select gate(s). Select gates can be configured such that some portion of every select gate of a block is adjacent some portion of each of the other select gates of the block and is non-adjacent some portion of each of the other select gates of the block.

According to certain embodiments, memory cells can be arranged in 3-dimensional cell strings, and select gates can be electrically coupled to the memory cells. The select gates can be separated into segments that are arranged in a two-dimensional matrix. Positions on the matrix can be referenced by a coordinate (i,j). For example, i can refer to a position in one (e.g., horizontal) dimension and j can refer to a position in another (e.g., vertical) dimension. Although horizontal and vertical dimensions are used in example, embodiments of the present disclosure are not limited to particular orientations. A select gate segment at (i, j) can be electrically coupled to a select gate segment at (i+1,j+1). A select gate segment at (i,j+1) can be electrically coupled to a select gate segment at (i+1,j). Furthermore, the select gate segment at (i+1,j+1) can be electrically coupled to a select gate segment at (i+2,j+2), and the select gate segment at (i+1,j) can be electrically coupled to a select gate segment at (i+2,j−1). In this manner, adjacent select gates can be transposed. Additional transpositions can result in the select gates having adjacent portions and non-adjacent portions with one another.

FIGS. 3A-3I illustrate a process flow for reducing coupling capacitance in accordance with one or more embodiments of the present disclosure.

Figure 3E:
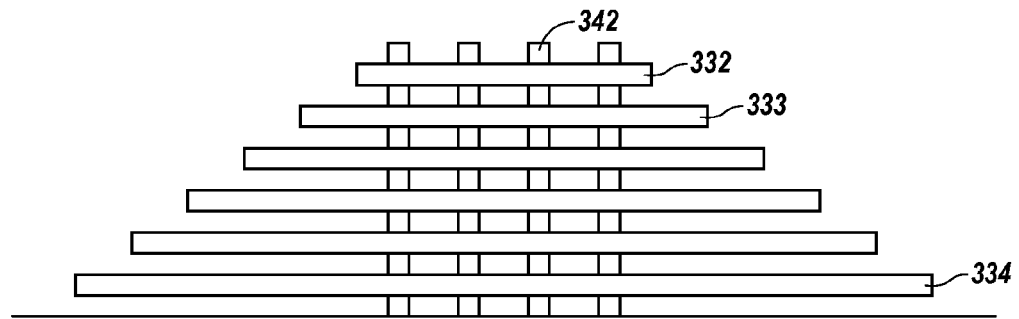

FIG. 3A shows a functional block diagram of a cross-sectional view of a memory cell array (e.g., 3D NAND) in accordance with one or more embodiments of the present disclosure. Material for the drain select gate 332, source select gate 334, and word-lines 333, located between the select gates, are stacked. Insulation portions of the memory cell array between the select gates 332, 334 and word lines 333 are omitted for clarity. The present disclosure is not limited to the quantity and/or arrangement of various select gate and/or word lines illustrated as one example in the figures. While only 4 word lines 333 are shown in FIGS. 3A-3I, embodiments of the present disclosure are not so limited, and can include more (e.g., 8) or fewer word lines 333 than is shown in the figures. FIG. 3B shows a functional block diagram of a top view of the memory cell array shown in FIG. 3A in accordance with one or more embodiments of the present disclosure. Form the top view, only the drain select gate 332 is visible in FIG. 3B.

FIG. 3C shows a functional block diagram of a cross-sectional view of the memory cell array shown in FIG. 3A after further processing in accordance with one or more embodiments of the present disclosure. Via holes 342 are formed from one edge of the memory cell array to another edge of the memory cell array (e.g., from the top to the bottom). The via holes 342 are formed through the select gates 332, 334 and word lines 333, as shown. FIG. 3D shows a functional block diagram of a top view of the memory cell array shown in FIG. 3C in accordance with one or more embodiments of the present disclosure. That is, FIG. 3D indicates the changes from FIG. 3B after further processing to form the via holes 342 through the drain select gate 332. While only four via holes 342 are shown in FIG. 3D, embodiments of the present disclosure are not so limited, and can include more (e.g., 20) or fewer via holes 342 than is shown in FIG. 3D.

FIG. 3E shows a functional block diagram of a cross-sectional view of the memory cell array shown in FIG. 3C after further processing in accordance with one or more embodiments of the present disclosure. FIG. 3E is shown being an expanded view with respect to FIG. 3C, and also is shown including additional via holes 342 from that shown in FIGS. 3C and 3D. FIG. 3E shows the edges of the select gates 332, 334 and word-lines 333 are formed (e.g., etched) into a staircase configuration. The term "staircase" is intended to mean a configuration where a first material, which can be located over a portion of a second material, is recessed in one direction such that the second material below can be accessed. For example, the first material may be formed over the second material but may not extend as far in a horizontal direction as the second material such that the second material can be accessed near its edges, for example, in a vertical direction.

Figure 3F:
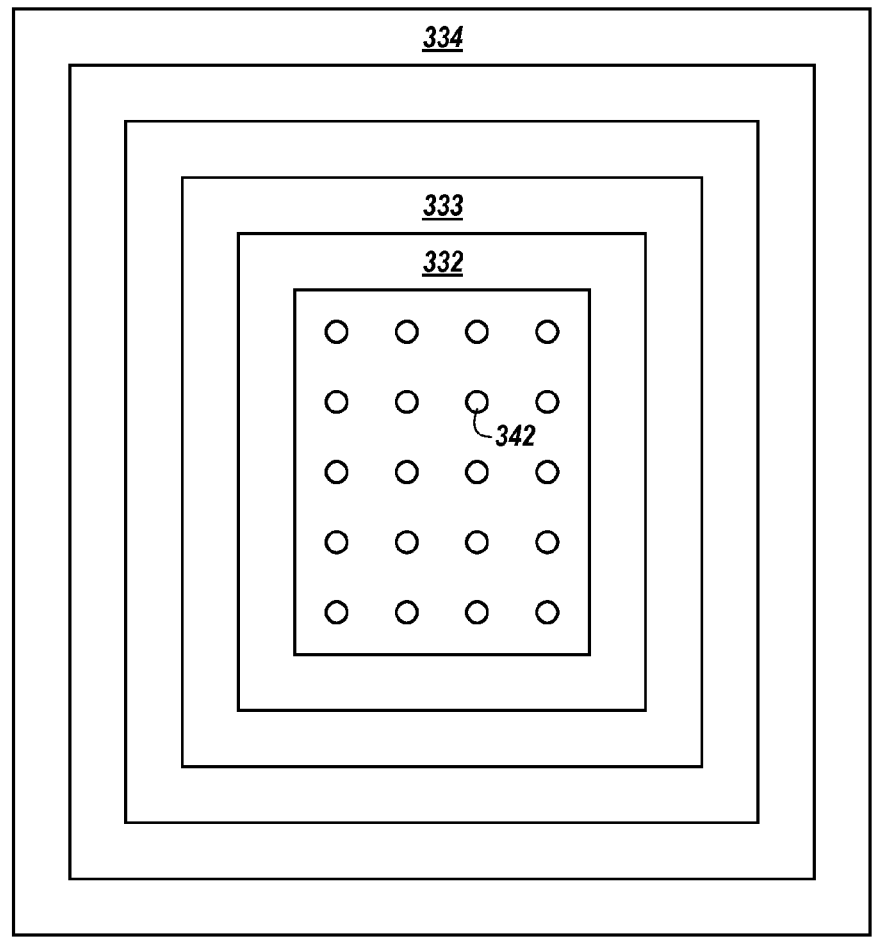

The edges of the select gates 332, 334 and word-lines 333 can be formed into a staircase configuration in at least one dimension (e.g., left-right, front-back), such as in two dimensions as further illustrated in FIG. 3F. FIG. 3F shows a functional block diagram of a top view of the memory cell array shown in FIG. 3E in accordance with one or more embodiments of the present disclosure. That is, FIG. 3F also indicates the changes from FIG. 3D after further processing to add more via holes 342 and form the select gates 332, 334 and word-lines 333 into a staircase shape in two dimensions. The dimensions of the "stair steps" can be such that individual select gates 332, 334 and word-lines 333 can be accessed from above, such as by forming of additional connecting structures. Other configurations to provide access from above to individual select gates 332, 334 and word-lines 333 can be formed in accordance with the present disclosure.

Figure 3G:
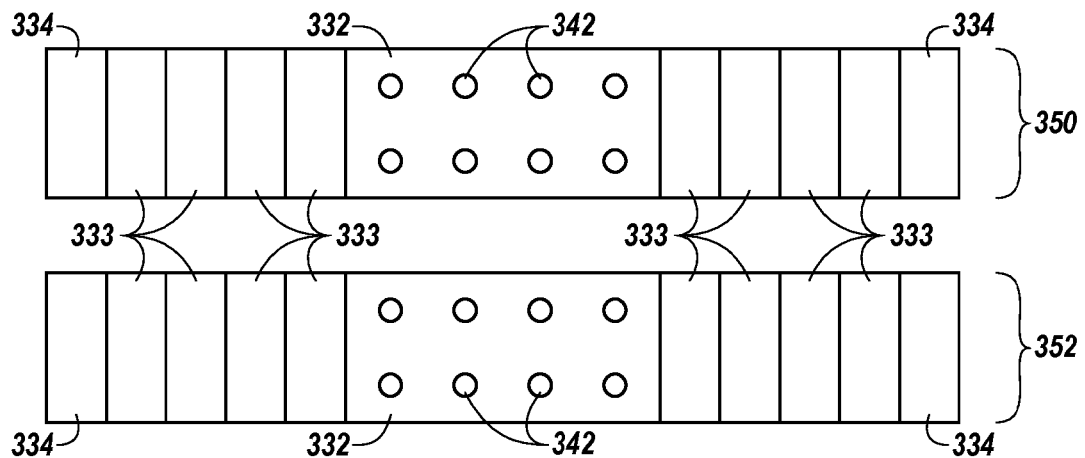

FIG. 3G shows a functional block diagram of a top view of the memory cell array shown in FIG. 3F after further processing in accordance with one or more embodiments of the present disclosure. FIG. 3G shows the select gates 332, 334 and word-lines 333 being further formed to separate those structures associated with a group of memory cells that are operated together (e.g., read, program, erase). That is, further forming can separate a first structure 350 (e.g., a first block BLK0) and a second structure 352 (e.g., a second block BLK1). While FIG. 3G shows separation of only two structures for simplicity, these methods can be applied to a greater quantity of structures being formed simultaneously.

Some row(s) of via holes 342 may be removed during the process of separating structures 350 and 352. However, removing via holes 342 may not be required. For example, the center row of via holes may not have been formed and therefore need not be removed, or structure separation may be accomplished between rows of formed via holes 342, etc.

Figure 3H:
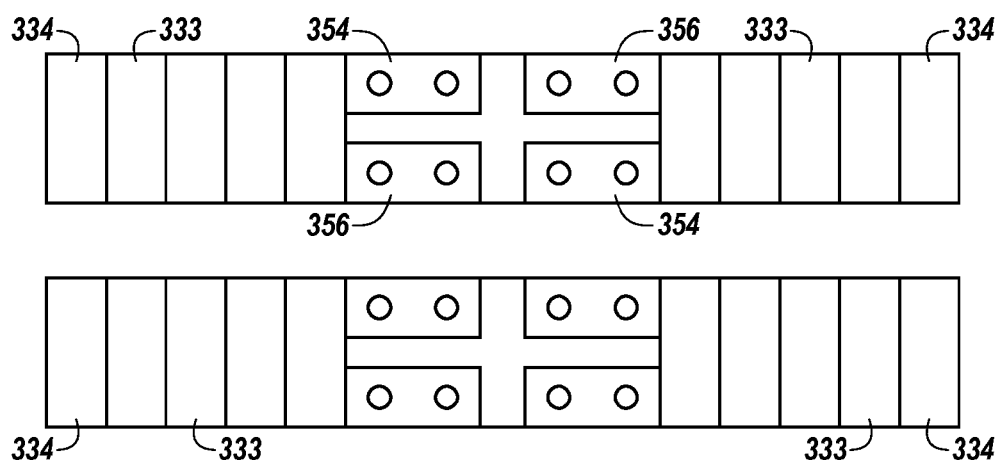

FIG. 3H shows a functional block diagram of the memory cell array shown in FIG. 3G in accordance with one or more embodiments of the present disclosure. That is, FIG. 3H reflects the changes from FIG. 3G after further processing to separate the drain select gate (e.g., 332 shown in FIG. 3G) into multiple segments (e.g., portions). The drain select gate 332 can be formed so as to be separated into segments that can be electrically coupled to constitute particular select gates (e.g., SGD0 and SGD1). For example, drain select gate segments 354 can be segments associated with SGD0, and drain select gate segments 356 can be segments associated with SGD1. The processing to further separate the drain select gate 332 into multiple segments can be accomplished together or individually. The number of segments into which drain select gate 332 can be separated can depend on the number of select gates per block and the number of segments per select gate. For example, the quantity by which the drain select gate 332 can be separated in one direction (e.g., horizontal direction as shown in FIG. 3H) can correspond to the number of select gates per block, and the quantity by which the drain select gate 332 can be separated in another direction (e.g., vertical direction as shown in FIG. 3H) can correspond to the number segments desired per select gate. According to one or more embodiments, select gates segments can be formed by at least one etch in directions that are substantially perpendicular to one another, for example.

Figure 3I:
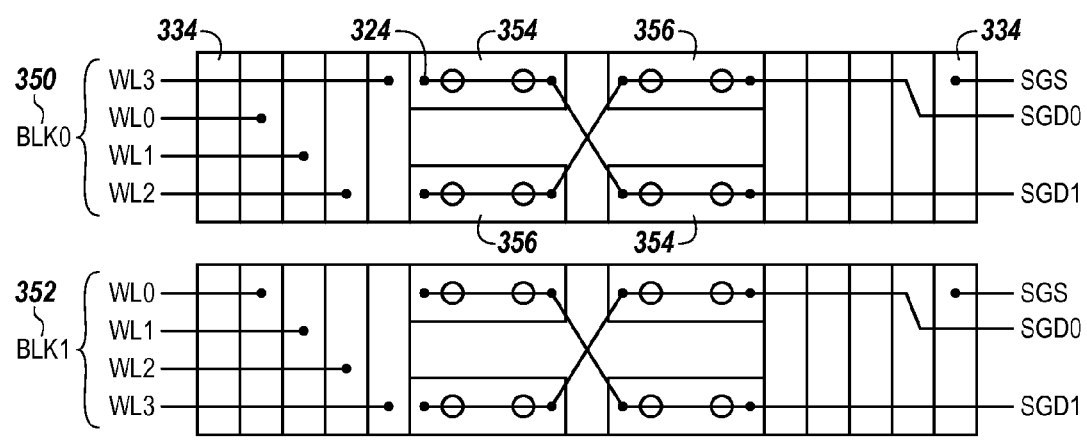

FIG. 3I shows a functional block diagram of the memory cell array shown in FIG. 3H in accordance with one or more embodiments of the present disclosure. That is, FIG. 3I reflects the changes from FIG. 3H after further processing to form interconnections between the various segments into which the drain select gate 332 was separated. For example, the left-top segment 354 of BLK0 (e.g., structure 350) can be electrically coupled with the right-bottom segment 354 of BLK0, with these two electrically coupled segments 354 being associated with select gate SGD1 of BLK0, as shown in FIG. 3I. Also, the left-bottom segment 356 of BLK0 can be electrically coupled with the right-top segment 356 of BLK0, with these two electrically coupled segments 356 being associated with select gate SGD0 of BLK0. Similar (or different) interconnections can be formed with respect to other separated structures (e.g., BLK1 352). That is, interconnections between select gate segments of BLK1 can be formed to achieve a select gate configuration for BLK1 that is similar to the select gate configuration of BLK0. Alternatively, interconnections between select gate segments can be formed to achieve a select gate configuration for BLK1 that can be different than the select gate configuration of BLK0. The forming of various transpositions is discussed in more detail below with respect to FIGS. 4-7.

In the manner illustrated as an example in FIGS. 3A-3I, transpositions can be formed between select gate segments towards forming a transposed select gate configuration to reduce the coupling capacitance between any two particular select gates. For example, transpositions can be formed between select gate segments towards forming the select gate configuration shown in FIG. 2B. For simplicity, FIG. 3I illustrates the forming of two select gates and two segments per select gate. However, embodiments of the present invention are not limited to these quantities used in example, and can be extended to form many more select gates, segments per select gate, and/or separated structures (e.g., blocks, sub-blocks, etc.). FIG. 3I additionally shows connections made to the various word lines 333 and the source select gate 334 at their respect edges, which are accessible at the respective stair step previously formed.

More generally, select gates of a multi-dimension (e.g., 3D) memory cell string can be separated into multiple segments in both an X and/or Y directions, with select gate segment SG(i,j) being electrically coupled with SG(i,j+1) or SG(i+1,j), where i and j are integers. According to certain embodiments, a first material of the select gates (e.g., conductively-doped polysilicon) can be separated into multiple (e.g., M) segments along the select gates. These multiple segments of two select gates can be arranged such that some segments are adjacent and some segments are non-adjacent (i.e., at least one other select gate segment separates the segments of two select gates).

A second material (e.g., metal) of the select gates can be routed across the cell array. That is, the second material can be routed across and between segments associated with a particular select gate. The second material can be electrically coupled to the first material near each end of a select gate segment. In this manner, the capacitive coupling between adjacent select gates for the second material can be reduced by a factor of 2/M since the distance that any pair of select gates is adjacent to one another is reduced to 2 of M segments. Reduced capacitive coupling between pairs of select gates can be associated with faster read and program operations in a cost effective way.

Figure 4A:
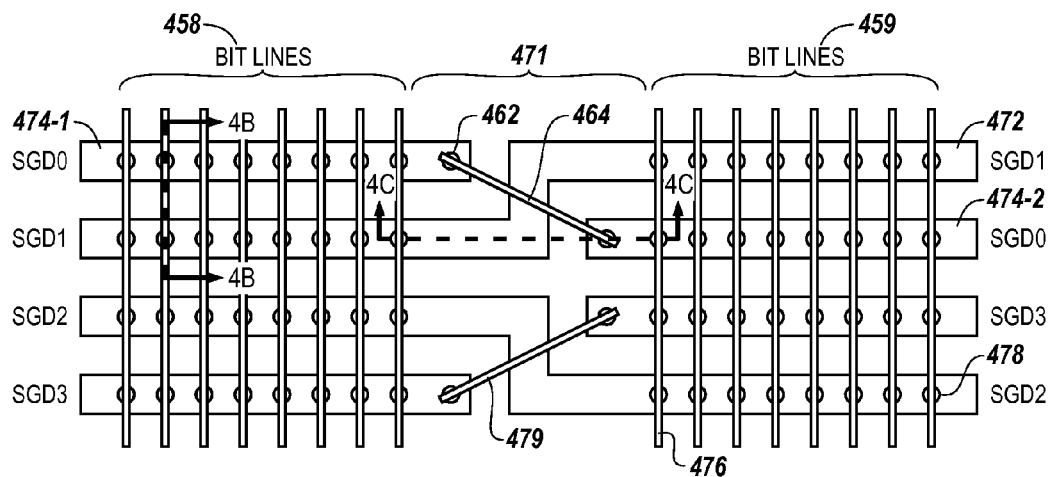
FIG. 4A is a functional block diagram of a top view illustrating an implementation of a transposed select gate using a first conductive material and a second conductive material without a metal shunt in accordance with one or more embodiments of the present disclosure.

FIG. 4A is a functional block diagram of a top view illustrating an implementation of a transposed select gate using a first conductive material and a second conductive material without a metal shunt in accordance with one or more embodiments of the present disclosure. According to various embodiments, the second conductive material can be less resistive (i.e., more conductive) than the first conductive material. The first conductive material can comprise conductively-doped polysilicon. The second conductive material can include a metal material or an alloy containing a metal material. A transition in the positioning of select gate segments in one dimension (e.g., up/down direction in FIG. 4A) can be accomplished with a first select gate having a continuous run of a first conductive material (e.g., conductively-doped polysilicon) to a new location in the dimension, and a second select gate having separated segments of the first conductive material interconnected by a second conductive material (e.g., metal, alloy). However, embodiments of the present disclosure are not so limited, and another material can be utilized for the first conductive material, and another conductive material can be used for the second conductive material.

For example as shown in FIG. 4A, select gates SGD0 and SGD1 can be transposed with one another, and select gates SGD2 and SGD3 can be transposed with one another at a transition area 471. Turning first to the transposition of select gates SGD0 and SGD1, a conductively-doped polysilicon portion 472 of drain select gate SGD1 can extend substantially perpendicular to a first number of bit lines 458 at one positioning along a dimension. The conductively-doped polysilicon portion 472 of drain select gate SGD1 can jog within the transition area 471 to a different positioning in the dimension, and can extend substantially perpendicular to a second number of bit lines 459 at the different positioning in the dimension. As can be seen in FIG. 4A, the run of the conductively-doped polysilicon portion 472 of drain select gate SGD1, including the jog in the transition area 471, can be continuous. The drain select gate SGD1 does not include a metal portion such as is shown in FIG. 2A at 222.

The conductively-doped polysilicon portion 472 of drain select gate SGD1 can jog within the transition area 471 so as to have a portion that can be substantially perpendicular to another portion. That is, conductively-doped polysilicon portion 472 of drain select gate SGD1 can jog within the transition area 471 using two discrete right angle turns, as shown in FIG. 4A. However, embodiments of the present disclosure are not so limited, and some embodiments can have a jog that can be formed having smooth curves of no more than 90 degrees of arc, or utilizing discrete turns of less than 90 degrees.

One transposition illustrated in FIG. 4A can involve select gates SGD0 and SGD1. Therefore, the jog of drain select gate SGD1 in the transition area 471 can be towards the location of the adjacent select gate (e.g., SGD0) with which the transposition is occurring. While FIG. 4A shows the conductively-doped polysilicon portion 472 of drain select gate SGD1 jogging through the transition area 471 and drain select gate SGD0 being discontinuous across the transition area 471, this arrangement can be "reversed" such that a conductively-doped polysilicon portion of drain select gate SGD0 can be made continuous (e.g., jogging through the transition area 471) and the conductively-doped polysilicon portion of select gate SGD1 can be made discontinuous across the transition area 471.

As shown in FIG. 4A, drain select gate SGD0 segments 474-1, 474-2 can be electrically coupled across the transition area 471 by an interconnection 464. That is, drain select gate SGD0 segment 474-1 can be electrically coupled to drain select gate SGD0 segment 474-2). Interconnection 464 can be, for example, formed of the second conductive material (e.g., metal, alloy). According to various embodiments, the bit lines (e.g., a first number of bit lines 458, a second number of bit lines 459, bit line 476) can also be formed of the second conductive material (e.g., metal, alloy) as well. Pillars 478 can be formed to electrically couple one or more bit lines (e.g., a first number of bit lines 458, a second number of bit lines 459, bit line 476) with one or more select gates (e.g., SGD0, SGD1, SGD2, SGD3).

The transposition of drain select gates SGD2 and SGD3 can be accomplished in a similar fashion. FIG. 4A shows a continuous portion of drain select gate SGD2 jogging in the transition area 471 and segments of drain select gate SGD3 formed from the first conductive material being discontinuous across the transition area 471 that are electrically coupled by an interconnect 479 routed over a continuous portion of drain select gate SGD2 jogging in the transition area 471. The transposition of drain select gates SGD2 and SGD3 are not limited to the configuration illustrated in FIG. 4A, and can be alternatively implemented with drain select gate SGD3 being continuous through the transition area 471 and drain select gate SGD2 being separated into segments that are interconnected by a metal interconnection routed over the jogging portion of drain select gate SGD3.

For simplicity, FIG. 4A shows transpositions between adjacent drain select gates. However, other transposition configurations may be formed. For example, transpositions can be formed between non-adjacent drain select gates using a jog that traverses at least one intervening drain select gate. A larger quantity of drain select gates can involve a great quantity of transpositions occurring within a transition area 471.

Figure 4B:
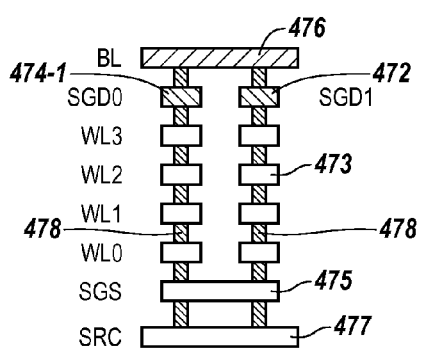
FIGS. 4B and 4C are functional block diagrams of cross-sectional views of the implementation of the transposed select gates shown in FIG. 4A in accordance with one or more embodiments of the present disclosure.
Figure 4C:
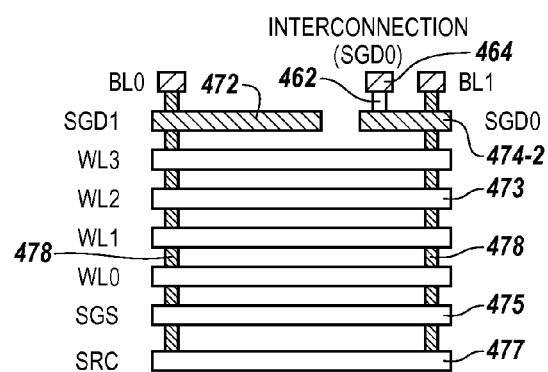

FIGS. 4B and 4C are functional block diagrams of cross-sectional views of the implementation of the transposed select gates shown in FIG. 4A in accordance with one or more embodiments of the present disclosure. FIG. 4B is a view taken along cut line 4B-4B shown in FIG. 4A and shows one possible stack structure of word lines 473 located between a source select gate 475 and drain select gates (e.g., SGD0 474-1 and 474-2, SGD1 472), which can be all located between perpendicularly-oriented bit lines (e.g., a first number of bit lines 458, a second number of bit lines 459). A communication path 478, which can be formed in the via holes shown in FIGS. 3D and 3F-I, connects the source line 477 and a bit line 476 through the drain 472, 474-1 and 474-2 and source select gates 475 and word lines 473. Although FIG. 4B shows four word lines 473 for simplicity of illustration, embodiments of the present disclosure are not so limited and more (e.g., eight) or fewer word lines 473 may be included in the stack structure.

FIG. 4C is a view taken along cut line 4C-4C shown in FIG. 4A and shows that interconnection 464, which connects drain select gate SGD0 segments 474-1, 474-2, can be formed so as to elevate the interconnection 464 above the elevation of the select gate SGD1 472, over which interconnection 464 is routed to accomplish the transposition. According to some embodiments, the interconnection 464 can be formed at the same elevation as the bit lines (e.g., BL0, BL1), and can be formed from the same conductive material as the bit lines (e.g., metal, alloy). The similar hatching pattern of BL0, BL1, and interconnection 464 indicates forming of similar materials. As such, the interconnection 464 can be formed by a same process and at a same time that the bit lines are formed.

Interconnection 464 can be electrically coupled to the drain select gate SGD0 segment 474-2 by a contact 462 between the first conductive material (e.g., conductively-doped polysilicon) of the drain select gate SGD0 segment 474-2 and the second conductive material (e.g., metal, alloy) of the interconnection 464, as shown in FIGS. 4A and 4C. Interconnection 464 can similarly be electrically coupled to the drain select gate SGD0 segment 474-1 by a contact 462 between the first conductive material (e.g., conductively-doped polysilicon) of the drain select gate SGD0 segment 474-1 and the second conductive material of the interconnection 464, as shown in FIG. 4A. According to various embodiments, the interconnection 464 can be electrically coupled near ends of the drain select gate SGD0 segments 474-1, 474-2 within (or nearest) the transition area 471. The interconnection 464 can be routed over the jog in the transition area 471 of the select gate with which the transposition is occurring. The transition area 471 can be located between the first number of bit lines 458 and the second number of bit lines 459 such that the interconnection 464 does not interfere with bit line routing at the same elevation, and vice versa.

Figure 5A:
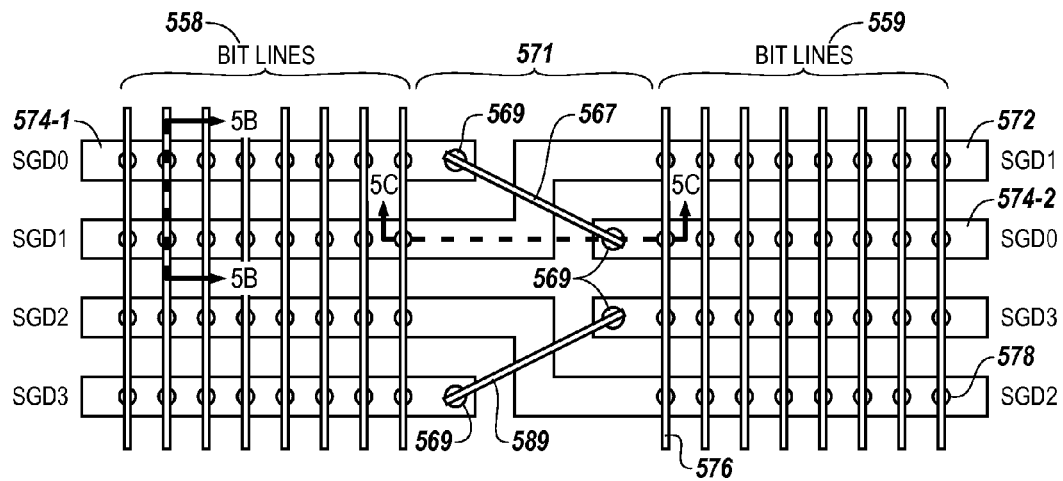
FIG. 5A is a functional block diagram of a top view illustrating an implementation of transposed select gates using segments of a first conductive material (without a shunt) electrically coupled by an interconnection of a third conductive material in accordance with one or more embodiments of the present disclosure.

FIG. 5A is a functional block diagram of a top view illustrating an implementation of transposed select gates using segments of a first conductive material (without a shunt) electrically coupled by an interconnection of a third conductive material in accordance with one or more embodiments of the present disclosure. The arrangement and attributes of the features shown in FIG. 5A are similar to those shown and described with respect to FIG. 4A with the exceptions described below. That is, transition area 571 is similar to transition area 471, first conductive material 572 is similar to material 472, segments 574-1 and 574-2 are similar to drain select gate SGD0 segments 474-1 and 474-2, bit lines 576, 558, and 559 are similar to bit lines 476, 458, and 459 respectively, and pillars 578 are similar to pillars 478.

Drain select gate SGD0 segments 574-1, 574-2 can be electrically coupled across the transition area 571 by an interconnection 567. That is, drain select gate SGD0 segment 574-1 can be electrically coupled to drain select gate SGD0 segment 574-2. Interconnection 567 can be, for example, formed of a third conductive material (e.g., metal, alloy). The third conductive material can be of the same or different composition than that of the second conductive material (e.g., metal, alloy), which can be used to form the bit lines 558 and 559 as discussed above with respect to FIGS. 4A-4C. According to various embodiments, the third conductive material can be less resistive (i.e., more conductive) than the second conductive material. However, embodiments of the present disclosure are not so limited, and in some embodiments interconnection 567 can be formed of the second conductive material. In some embodiments particular features can be formed at a same or different elevation as other features, and/or formed at a same or different step in the forming process as other features. Interconnection 567 can be electrically coupled at each end by a contact 562, as discussed further below. Additional interconnection(s) 589 can electrically couple other drain select gate segments (e.g., SGD3) across the transition area 571. The additional interconnection(s) 589 can be electrically coupled to the other drain select gate segments (e.g., SGD3) by contacts 562 in a similar manner as discussed above.

Figure 5B:
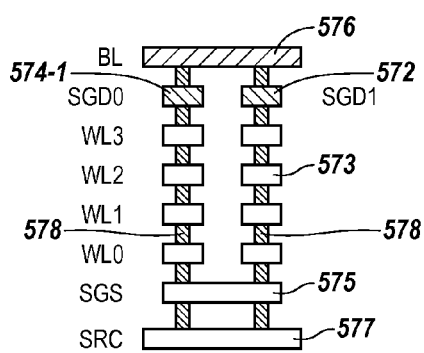
FIGS. 5B and 5C are functional block diagrams of cross-sectional views of the implementation of transposed select gates shown in FIG. 5A in accordance with one or more embodiments of the present disclosure.
Figure 5C:
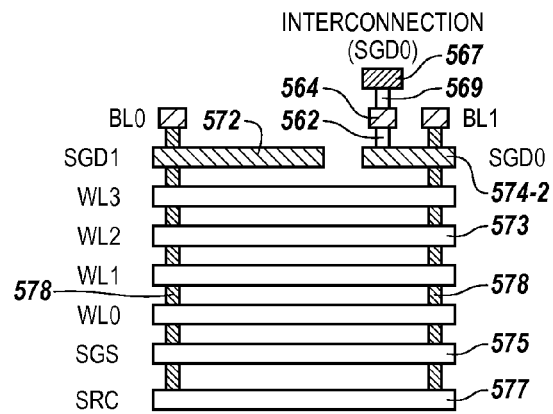

FIGS. 5B and 5C are functional block diagrams of cross-sectional views of the implementation of transposed select gates shown in FIG. 5A in accordance with one or more embodiments of the present disclosure. FIG. 5B is a view taken along cut line 5B-5B shown in FIG. 5A and shows one possible stack structure of word lines 573 located between a source select gate 575 and drain select gates SGD0 574-1 and 574-2, SGD1 572, which can all be located between perpendicularly-oriented source line 577 and a bit line 576. The arrangement and attributes of the features shown in FIG. 5B are similar to those shown and described with respect to FIG. 4B.

FIG. 5C is a view taken along cut line 5C-5C shown in FIG. 5A and shows that an interconnection 567, which connects drain select gate SGD0 segments 574-1 and 574-2, can be formed so as to elevate the interconnection 567 not only above the elevation of the select gate SGD1 572, over which interconnection 567 is routed to accomplish the transposition, but also interconnection 567 can be formed above the elevation at which the bit lines (e.g., B0, B1, 576, 558, 559) are formed. According to various embodiments, the interconnection 567 can be electrically coupled near ends of the drain select gate SGD0 segments 574-1 and 574-2 within the transition area 571. The interconnection 567 can pass over the jog in the transition area 571 of the select gate with which the transposition is occurring. The transition area 571 can be located between the first number of bit lines 558 and the second number of bit lines 559. Interconnection 567 can be formed so as not interfere with bit line routing, and vice versa.

Interconnection 567 can be electrically coupled to each of the drain select gate SGD0 segments 574-1 and 574-1 by a respective first contact 569, a respective portion of the second conductive material 564, and a respective second contact 562. In this manner, an electrical path can be established between interconnection 567 and the drain select gate SGD0 segments, which are formed of the first conductive material (e.g., conductively-doped polysilicon). Communication path 578 can be formed to electrically couple one or more bit lines 576 with one or more select gates (e.g., SGD0, SGD1, SGD2, SGD3).

Figure 6A:
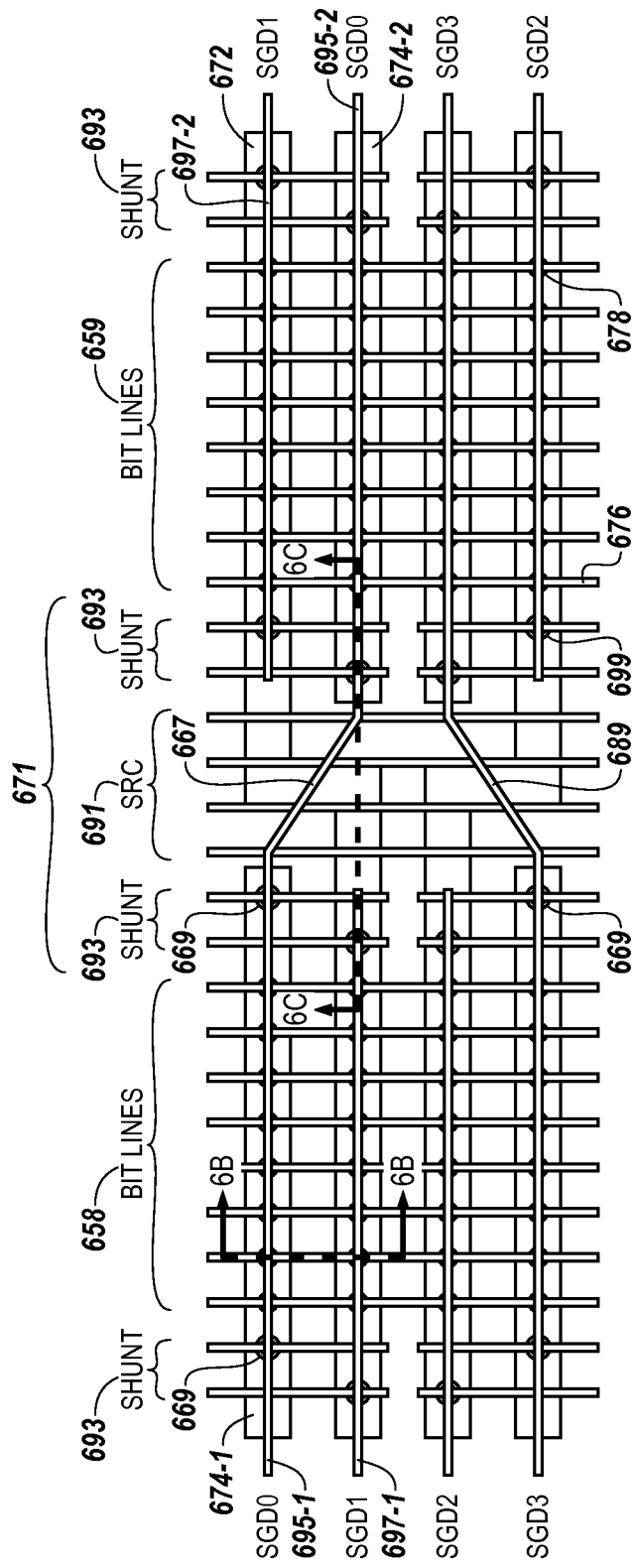
FIG. 6A is a functional block diagram of a top view illustrating an implementation of transposed select gates using segments of a first conductive material (with a shunt) electrically coupled by an interconnection of a third conductive material in accordance with one or more embodiments of the present disclosure.

FIG. 6A is a functional block diagram of a top view illustrating an implementation of transposed select gates using segments of a first conductive material (with a shunt) electrically coupled by an interconnection of a third conductive material in accordance with one or more embodiments of the present disclosure. The arrangement and attributes of the features shown in FIG. 6A are similar to those shown and described with respect to FIG. 4A with the exceptions described below. That is, transition area 671 is similar to transition area 471, first conductive material 672 is similar to first conductive material 472, segments 674-1 and 674-2 are similar to drain select gate SGD0 segments 474-1 and 474-2, bit lines 676, 658, and 659 are similar to bit lines 476, 458, and 459 respectively, and pillars 678 are similar to pillars 478.

Conductive shunts 695-1 and 695-2, 697-1 and 697-2 can be formed of a third conductive material (e.g., metal, alloy), which can be of a different composition than the first and/or second-conductive materials. However, embodiments of the present disclosure are not so limited, and the composition of the first, second, and/or third conductive material can be the same. For example, the first, second, and/or third conductive materials can be of a same composition in some embodiments, but formed at different elevations in an apparatus. Also, other (e.g., non-metallic) conductive materials can be utilized for the bit lines, second conductive and/or third conductive materials, such as conductively-doped polysilicon.

The conductive shunts 697-1 and 697-2 corresponding to the first conductive material 672 of select gate SGD1 can be discontinuous, as shown in FIG. 6A. The other select gate involved in the transposition (e.g., SGD0) can have separated segments 674-1 and 674-2 comprised of the first conductive material (e.g., conductively-doped polysilicon) and corresponding conductive shunts 695-1 and 695-2 that are electrically coupled via an interconnection 667, which is continuous with the shunts 695-1 and 695-2 and which thereby electrically couples the separated segments of first conductive material 674-1 and 674-2.

The interconnection 667 can be routed over the jog in the transition area 671 of the first conductive material 672 for the select gate (e.g., SGD1) with which the transposition is occurring. Interconnection 667 can be formed so as not interfere with routing of the bit lines 658, 659, the intervening discontinuous portions of second conductive material 693 (e.g., shunts), and the number of conductive source lines 691 by being formed at a different elevation. The interconnection 667 can be formed of the third conductive material (e.g., metal, alloy).

As shown in FIG. 6A, select gates SGD0 and SGD1 can be transposed with one another, and select gates SGD2 and SGD3 can be transposed with one another at the transition area 671. Within the transition area 671, shunts 693 and a number of conductive source lines 691 can be formed between a first number of bit lines 658 and a second number of bit lines 659. The shunts 693 and conductive source lines 691 can be formed to be substantially parallel to the first number of bit lines 658 and the second number of bit lines 659. Other shunts 693 can be formed outside the transition area 671 substantially parallel to the first number of bit lines 658 and the second number of bit lines 659. The various shunts 693 and conductive source lines 691 can be formed of the same material (e.g., third conductive material) as the first number of bit lines 658 and the second number of bit lines 659, and therefore, can be formed by a same process as the first number of bit lines 658 and the second number of bit lines 659.

Segments of the first conductive material 674-1 and 674-2 and conductive shunts 695-1 and 695-2 of drain select gate SGD0 segments can be electrically coupled across the transition area 671 by an interconnection 667. Interconnection 667 can be electrically coupled to an end of one of drain select gate SGD0 segments, for example, via a contact 669, shunt 693, and contact 662, as discussed further below. Other interconnection(s) 689 can electrically couple other drain select gate segments (e.g., of SGD3) across the transition area 671. These other interconnection(s) 689 can be electrically coupled to the other drain select gate segments (e.g., of SGD3) by contacts 669, shunts 693 and contacts 662 in a similar manner as discussed above.

Figure 6B:
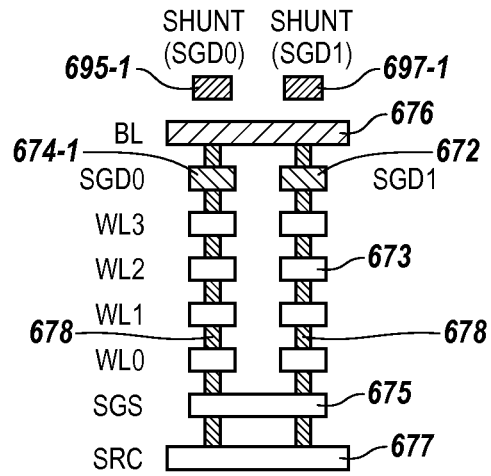
FIGS. 6B and 6C are functional block diagrams of cross-sectional views of the implementation of transposed select gates shown in FIG. 6A in accordance with one or more embodiments of the present disclosure.
Figure 6C:
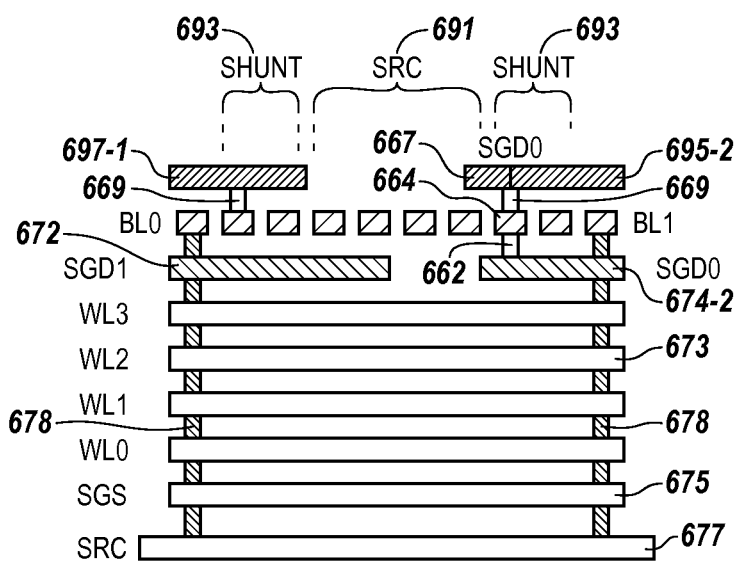

FIGS. 6B and 6C are functional block diagrams of cross-sectional views of the implementation of transposed select gates shown in FIG. 6A in accordance with one or more embodiments of the present disclosure. FIG. 6B is a view taken along cut line 6B-6B shown in FIG. 6A and shows one possible stack structure of word lines 673 located between a source select gate 675 and drain select gates (e.g., SGD0 674-1 and 674-2, SGD1 672), which can all be located between perpendicularly-oriented source line 677 and a bit line 676. The arrangement and attributes of the features shown in FIG. 6B are similar to those shown and described with respect to FIG. 4B, with the addition of the conductive shunt 695-1 of SGD0 and the conductive shunt 697-1 of SGD1 located above the bit line 676.

FIG. 6C is a view taken along cut line 6C-6C shown in FIG. 6A and shows a number of shunts 693 and a number of conductive source lines 691 located between bit lines BL0 and BL1 at a same elevation. The number of shunts 693, the number of conductive source lines 691, and bit lines BL0 and BL1 can be formed of a second conductive material (e.g., metal, alloy), as indicated by a same cross-hatching in FIG. 6C.

FIG. 6C also shows that an interconnection 667, which connects drain select gate SGD0 segment 674-1 and conductive shunt 695-1 to drain select gate SGD0 segment 674-2 and conductive shunt 695-2, can be formed so as to elevate the interconnection 667 not only above the elevation of the first conductive material 672 for select gate SGD1 but also above the elevation of the bit lines (e.g., BL0, BL1), the number of shunts 693, and the number of conductive source lines 691. According to various embodiments, the interconnection 667 can be electrically coupled near ends of the first conductive material segments 674-1 and 674-2 and the conductive shunt segments 695-1 and 695-2 of the drain select gate SGD0 within or adjacent to the transition area 671, as shown in FIG. 6A.

Interconnection 667 and conductive shunt 695-2 can be electrically coupled to a conductive material portion 664 by a first contact 669, and conductive material portion 664 can be electrically coupled to the segment of first conductive material 674-2 for drain select gate SGD0 by a second contact 662. In this manner, an electrical path can be established between interconnection 667 and conductive shunt 695-2 and the segment of first conductive material 674 for drain select gate SGD0. Communication path 678 can be formed to electrically couple one or more bit lines (e.g., BL0, BL1) through the drain select gates (e.g., SGD0, SGD1), word lines 673, and source select gate 675 to the source line 677.

Figure 7A:
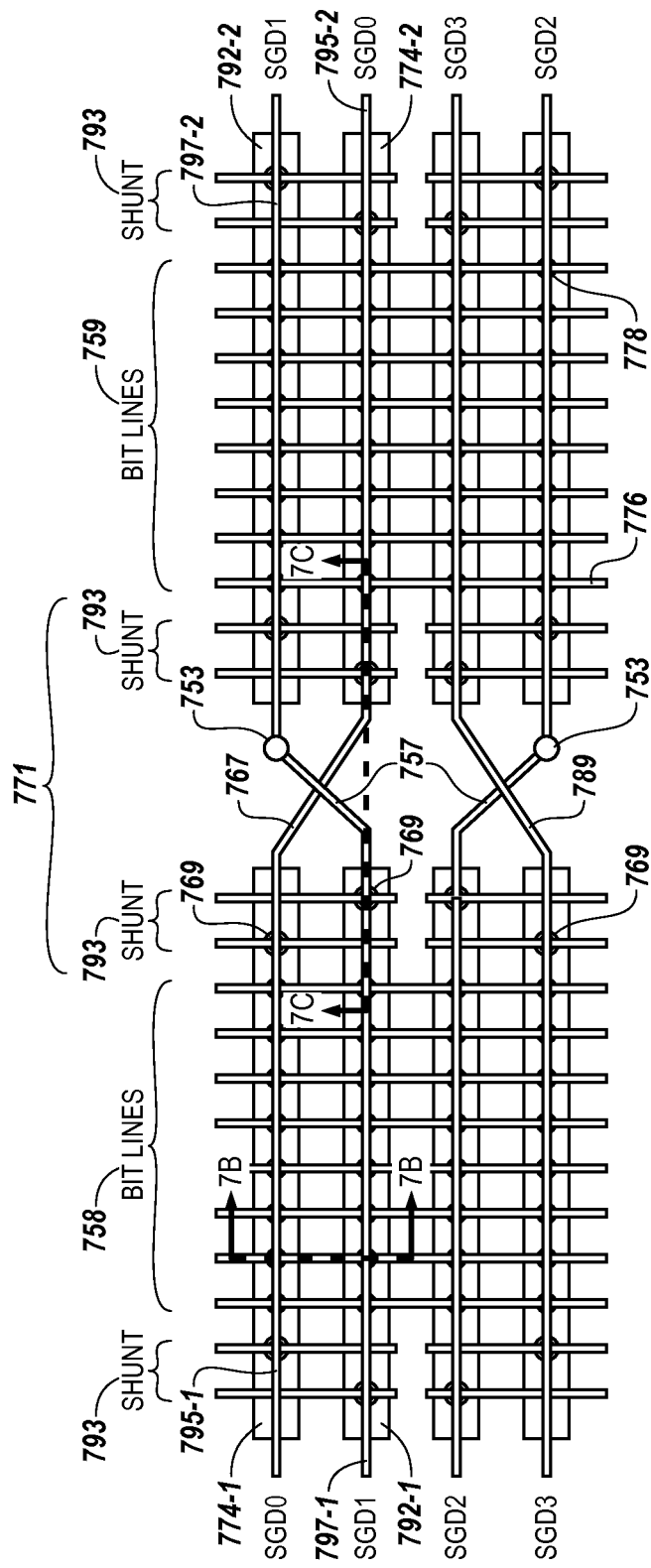
FIG. 7A is a functional block diagram of a top view illustrating an implementation of transposed select gates using segments of a first conductive material (and a shunt) electrically coupled by interconnections of a second and third conductive materials in accordance with one or more embodiments of the present disclosure.

FIG. 7A is a functional block diagram of a top view illustrating an implementation of transposed select gates using segments of a first conductive material (and a shunt) electrically coupled by interconnections of a second and third conductive materials in accordance with one or more embodiments of the present disclosure. The arrangement and attributes of the features shown in FIG. 7A are similar to those shown and described with respect to FIG. 6A with the exceptions described below. That is, transition area 771 is similar to transition area 671, segments 774-1 and 774-2 are similar to drain select gate SGD0 segments 674-1 and 674-2, conductive shunts 795-1, 795-2, 797-1, and 797-2 are similar to conductive shunts 695-1, 695-2, 697-1, and 697-2 respectively, bit lines 776, 758, and 759 are similar to bit lines 676, 658, and 659 respectively, (e.g., intervening discontinuous portions of second conductive material 793 (e.g., shunts) are similar to shunts 693, and pillars 778 are similar to pillars 678.

The arrangement shown in FIG. 7A is different from the arrangement shown in FIG. 6A in some respects. For example, FIG. 6A shows first conductive material 672 of drain select gate SGD1 being continuous across, and jogging within, the transition area 671. In contrast, FIG. 7A shows the first conductive material of drain select gate SGD1 being discontinuous across the transition area 671. Instead, two segments of first conductive material 792-1 and 792-1, and conductive shunts 797-1 and 797-2 of drain select gate SGD1 can be interconnected across the transition area 771 by an interconnect 757.

Figure 7B:
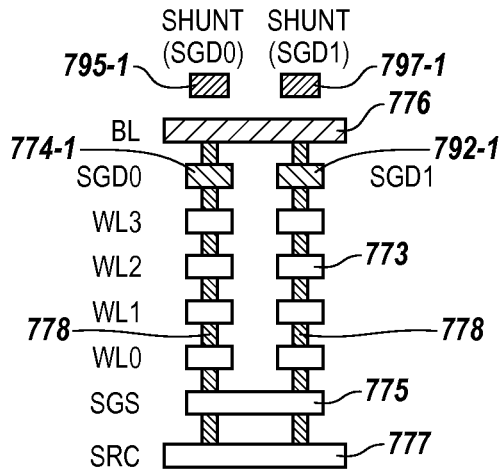
FIGS. 7B and 7C are functional block diagrams of cross-sectional views of the implementation of a transposed select shown in FIG. 7A in accordance with one or more embodiments of the present disclosure.
Figure 7C:
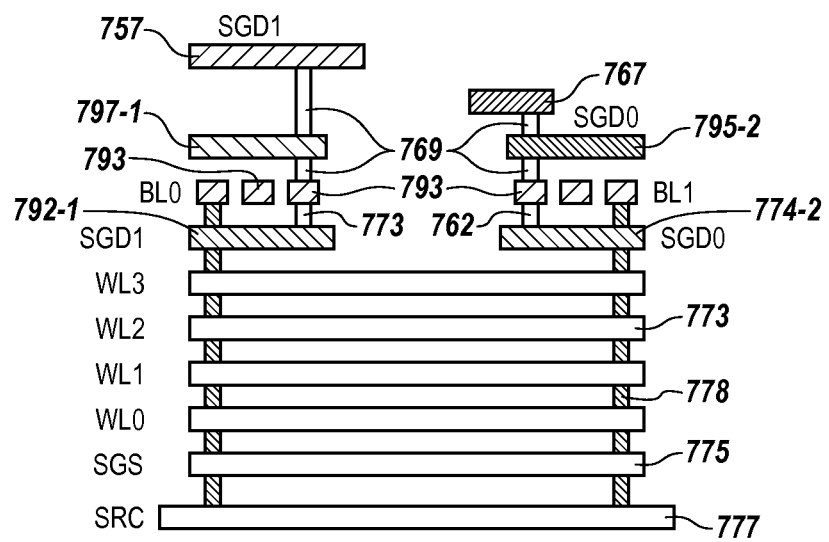

Interconnect 757 can be electrically coupled to the conductive shunt 797-2 of drain select gate SGD1 on the right side of the transition area 771 by a contact 753, and interconnect 757 can be electrically coupled to the segment of the first conductive material 792-1 and conductive shunt 797-1 of drain select gate SGD1 on the left side of the transition area 771 by a contact 769. According to some embodiments, the interconnection 757 can be formed at a same elevation as the conductive shunts 797-1 and 797-2. However, embodiments of the present disclosure are not so limited, and interconnection 757 can be formed at a different elevation as one or both of the conductive shunts 797-1 and 797-2, and coupled thereto by a contact as shown in FIGS. 7A-C. According to various embodiments, interconnections 757 and 767 can be formed at different elevations to enable one crossing over the other. Furthermore, interconnection 757 can be formed to pass over another interconnection (e.g., 767) or under another interconnection (e.g. 789) in the transition area 771, as shown in FIG. 7A.

Segments of the first conductive material 774-1 and 774-2 and conductive shunts 795-1 and 795-2 of drain select gate SGD0 segments can be electrically coupled across the transition area 771 by an interconnection 767. According to some embodiments, the interconnection 767 can be formed at a same elevation as the conductive shunts 795-1 and 795-2. However, embodiments of the present disclosure are not so limited, and interconnection 767 can be formed at a different elevation as one or both of the conductive shunts 795-1 and 795-2, and coupled thereto by a contact as shown in FIGS. 7A-C. Interconnection 767 can electrically couple ends of drain select gate SGD0 segments, for example, via a contact 769 at each end of interconnection 767. In a similar manner, other interconnections 757 and 789 can electrically couple respective other drain select gate segments (e.g., SGD2, SGD3), including the first conductive material and corresponding conductive shunts, across the transition area 771 as shown in FIG. 7A.

FIGS. 7B and 7C are functional block diagrams of cross-sectional views of the implementation of transposed select gates shown in FIG. 7A in accordance with one or more embodiments of the present disclosure. FIG. 7B is a view taken along cut line 7B-7B shown in FIG. 7A and shows a stack structure of word lines 773 located between a source select gate 775 and drain select gates (e.g., SGD0 774-1, SGD1 792-1), which can all be located between perpendicularly-oriented source line 777 and bit line 776. The arrangement and attributes of the features shown in FIG. 7B are similar to those shown and described with respect to FIG. 6B with the exception that in FIG. 7B the first conductive material for SGD1 792-1 is not continuous across the transition area 771, as opposed to the continuous first conductive material 672 shown in FIG. 6B.

FIG. 7C is a view taken along cut line 7C-7C shown in FIG. 7A. The arrangement and attributes of the features shown in FIG. 7C are similar to those shown and described with respect to FIG. 6C with the exception of the additional interconnection 757 and associated structures described further below.

FIG. 7C also shows that one of the shunts 793 can be electrically coupled to a segment of first conductive material 792-1 and interconnect 757 and conductive shunt 797-1 by contact 769. Another one of the shunts 793 can be electrically coupled to a segment of first conductive material 774-2 and interconnect 767 and conductive shunt 795-2 by contact 769.

According to one or more embodiments, interconnection 757 can be formed from the third conductive material (e.g., metal, alloy), which can be used to form the bit lines 758, 759, 776 and the shunts 793. According to one or more embodiments, interconnection 767 can be formed from the third conductive material (e.g., metal, alloy), which can be used to form the conductive shunts 795-1 and 795-2 of SGD0 and the conductive shunts 797-1 and 797-2 of SGD1. However, embodiments of the present disclosure are not so limited, and interconnection 757 and interconnection 767 can be formed of a same conductive material (e.g., second conductive material, third conductive material) or another (e.g., non-metallic) conductive material. For example, according to various embodiments of the present disclosure interconnection 767 can be formed of a fourth conductive material, different from the third conductive material used to form interconnection 757.

Interconnection 757 can be formed at a different elevation than interconnection 767 such that the interconnections do not interfere with one another as they cross one another. For example, interconnection 757 can be formed at a lower elevation than interconnection 767 such that interconnection 767 can be routed further away from the word lines 773 than interconnection 757. Alternatively, interconnection 767 can be formed at a lower elevation than interconnection 757 such that interconnection 757 can be routed further away from the word lines 773 than interconnection 767.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
a group of memory cells; and
select gates electrically coupled to the group of memory cells, wherein the select gates are arranged such that a pair of select gates is adjacent to each other along a first portion of each of the pair of select gates and are non-adjacent along a second portion of each of the pair of select gates,
wherein the respective select gates of each pair of the select gates are transposed with one another at least once.

2. The apparatus of claim 1, wherein the select gates are further arranged such that a first portion of each other of the select gates is adjacent to a first respective one of a number of portions of a particular select gate.

3. The apparatus of claim 2, wherein the select gates are further arranged such that a second portion of each other of the select gates is non-adjacent to a second respective one of a number of portions of a particular select gate.

4. The apparatus of claim 1, wherein the select gates are further arranged such that one portion of every select gate is adjacent to a first respective portion of each other of the select gates and is non-adjacent a second respective portion of each other of the select gates.

5. The apparatus of claim 1, wherein each of the select gates are transposed at least once with each other of the select gates.

6. The apparatus of claim 1, wherein at least two, but less than all, of the select gates are transposed with one another.

7. An apparatus, comprising:
a number of memory cells; and
N select gates electrically coupled to the number of memory cells, N being greater than 1, each select gate being separated into M segments, M being greater than 1,
wherein at least some of the N select gates are transposed with one another at least once and the M segments of the N select gates are arranged such that less than M segments of a first select gate are adjacent to segments of a second select gate.

8. The apparatus of claim 7, wherein at least 2 segments of the first select gate are adjacent to at least 2 segments of the second select gate.

9. The apparatus of claim 7, wherein M equals N.

10. The apparatus of claim 9, wherein M is less than N.

11. The apparatus of claim 7, wherein the M segments of the N select gates are arranged such that at most 2 segments of the each select gate are adjacent to a number of segments of any other particular select gate.

12. The apparatus of claim 7, wherein the M segments of the N select gates are arranged such that segments of each select gate are adjacent to segments of all of the other select gates of a block.

13. The apparatus of claim 7, wherein the number of memory cells are arranged in a 3-dimensional NAND memory device architecture.

14. An apparatus, comprising:
memory cells arranged in 3-dimensional memory cell strings; and
select gates electrically coupled to the memory cells,
wherein the select gates are separated into segments, the segments being arranged in a two-dimensional matrix, positions on the matrix being referenced by coordinates (i,j), and
wherein a select gate segment at (i,j) is electrically coupled to a select gate segment at (i+1,j+1) and a select gate segment at (i,j+1) is electrically coupled to a select gate segment at (i+1,j).

15. The apparatus of claim 14, wherein the select gate segment at (i+1,j+1) is electrically coupled to a select gate segment at (i+2,j+2) and the select gate segment at (i+1,j) is electrically coupled to a select gate segment at (i+2,j−1).

16. The apparatus of claim 14, wherein the select gate segment at (i+1,j+1) is electrically coupled to a select gate segment at (i+2,j+1) and the select gate segment at (i+1,j) is electrically coupled to a select gate segment at (i+2,j−1).

17. An apparatus, comprising:
a group of memory cells; and
select gates electrically coupled to the group of memory cells,
wherein at least one pair of the select gates has a transposition thereof such that a first one of the select gates of the pair of select gates is adjacent a third one of the select gates on a first side of the transposition and a second one of the select gates of the pair of select gates is adjacent the third one of the select gates on a second side of the transposition.

18. The apparatus of claim 17, wherein the transposition includes first conductive material of a first select gate being routed between segments of first conductive material of a second select gate, the segments of first conductive material of the second select gate being electrically coupled by an interconnect formed of a second conductive material routed over the first conductive material of the first select gate.

19. The apparatus of claim 18, wherein the first conductive material of the first select gate and the first conductive material of the second select gate are conductively-doped polysilicon.

20. The apparatus of claim 18, wherein the second conductive material comprises a metal material.

21. The apparatus of claim 18, wherein the interconnect is at a different elevation than the first conductive material of the first and second select gates.

22. The apparatus of claim 18, further including data lines electrically coupled to the select gates, the data lines comprising the second conductive material.

23. The apparatus of claim 22, wherein the interconnect is formed by a same process and of a same material as the data lines.

24. The apparatus of claim 22, wherein the interconnect is at a same elevation as the data lines.

25. An apparatus, comprising:
a group of memory cells;
select gates electrically coupled to the group of memory cells, a pair of the select gates including a transposition thereof; and
data lines electrically coupled to the select gates,
wherein the transposition includes first conductive material of a first select gate being routed between segments of first conductive material of a second select gate, the segments of first conductive material of the second select gate being electrically coupled by an interconnect formed of a second conductive material routed over the first conductive material of the first select gate, and wherein the data lines are formed of a third conductive material.

26. The apparatus of claim 25, wherein the second conductive material is different than the first conductive material and the third conductive material comprises a same material composition, but are formed at different elevations in the apparatus.

27. The apparatus of claim 25, wherein the interconnect is electrically coupled to the segments of the first conductive material of the second select gate through portions of the third conductive material.

28. The apparatus of claim 25, wherein the interconnection is at a same elevation as the data lines.

29. The apparatus of claim 25, wherein the interconnect is at a different elevation than the data lines.

30. The apparatus of claim 25, wherein the interconnect is at a different elevation than the semiconductor material of the first and second select gates.

31. The apparatus of claim 25, wherein:
the first conductive material of the first select gate is electrically to corresponding shunts of the second conductive material,
the segments of first conductive material of the second select gate are electrically coupled to corresponding shunts of the second conductive material, and
the interconnect is continuous with the shunts corresponding to the segments of the first conductive material of the second select gate.

32. An apparatus, comprising:
a group of memory cells; and
select gates electrically coupled to the group of memory cells, each of the select gates being separated into segments, a pair of the select gates including a transposition thereof,
wherein the transposition includes a first interconnect between respective segments of a first select gate and a second interconnect between respective segments of a second select gate.

33. The apparatus of claim 32, further comprising data lines electrically coupled to the select gates, wherein the data lines are at a different elevation of the apparatus than the interconnects.

34. The apparatus of claim 33, wherein each of the segments comprises a conductively-doped polysilicon portion and a metal portion.

35. The apparatus of claim 33, wherein the first interconnect is at a different elevation than the second interconnect.

36. A method of forming transposed select gates, comprising:
forming a select gate first conductive material into a matrix of segments in two dimensions; and
forming a corresponding second conductive material over each segment, the corresponding second conductive material being electrically coupled near a respective end of each segment,
wherein segments are coupled together into select gates traversing one of the two dimensions.

37. The method of claim 36, wherein forming a corresponding second conductive material comprises implementing a transposition of particular select gates in a second one of the two dimensions.

38. The method of claim 36, wherein forming the select gate first conductive material into the matrix of segments in two dimensions includes:
forming the select gate first conductive material over a plurality of access lines in a stacked arrangement; and
separating the select gate first conductive material into a matrix of segments in two dimensions,
the method further including removing portions of the select gate and the plurality of access lines so as to expose each of the plurality of access lines in a staircase configuration.

39. The method of claim 38, further including separating the select gate first conductive material, the plurality of access lines, and the source select gate in the stacked arrangement into a plurality of stacked structures.

* * * * *

UNITED STATES PATENT AND TRADEMARK OFFICE
CERTIFICATE OF CORRECTION

PATENT NO. : 8,796,778 B2  
APPLICATION NO. : 13/316026  
DATED : August 5, 2014  
INVENTOR(S) : Toru Tanzawa Page 1 of 1

It is certified that error appears in the above-identified patent and that said Letters Patent is hereby corrected as shown below:

On the Title Page

In item (74), in column 2, in "Attorney, Agent or Firm", line 2, delete "Heubsch," and insert -- Huebsch, --, therefor.

In the Claims

In column 20, line 6, in Claim 31, after "electrically" insert -- coupled --.

Signed and Sealed this  
Twenty-first Day of October, 2014

Michelle K. Lee  
*Deputy Director of the United States Patent and Trademark Office*